(12) United States Patent
Gibson et al.

(10) Patent No.: US 8,168,884 B2
(45) Date of Patent: *May 1, 2012

(54) SOLAR CELL STRUCTURE INCLUDING A PLURALITY OF CONCENTRATOR ELEMENTS WITH A NOTCH DESIGN AND PREDETERMINED RADII AND METHOD

(75) Inventors: Kevin R. Gibson, Redwood City, CA (US); Alelie Funcell, Fremont, CA (US)

(73) Assignee: Solaria Corporation, Fremont, CA (US)

( * ) Notice: Subject to any disclaimer, the term of this patent is extended or adjusted under 35 U.S.C. 154(b) by 19 days.

This patent is subject to a terminal disclaimer.

(21) Appl. No.: 12/327,743

(22) Filed: Jan. 7, 2009

(65) Prior Publication Data

US 2010/0071753 A1    Mar. 25, 2010

Related U.S. Application Data

(60) Provisional application No. 61/019,135, filed on Jan. 4, 2008.

(51) Int. Cl.
*H02N 6/00* (2006.01)
*C03B 17/00* (2006.01)
(52) U.S. Cl. .............. 136/246; 136/259; 65/90
(58) Field of Classification Search .......... 136/259, 136/246; 359/894; 65/90
See application file for complete search history.

(56) References Cited

U.S. PATENT DOCUMENTS

| | | | |
|---|---|---|---|
| 4,830,038 A * | 5/1989 | Anderson et al. | 136/251 |
| 6,020,553 A | 2/2000 | Yogev | |
| 6,609,836 B1 | 8/2003 | Antonelli et al. | |
| 2003/0074976 A1 | 4/2003 | Ahmad | |
| 2006/0272698 A1* | 12/2006 | Durvasula | 136/246 |
| 2006/0283495 A1 | 12/2006 | Gibson | |

OTHER PUBLICATIONS

Leguillon, Dominique et al., "Crack onset at a v-notch. Influence of the notch tip radius", Aug. 2003, International Journal of Fracture, 122, pp. 1-21.*
International Search Report and Written Opinion of PCT Application No. PCT/US08/59170, date of mailing Aug. 8, 2008, 11 pages total.

* cited by examiner

*Primary Examiner* — Basia Ridley
*Assistant Examiner* — Tamir Ayad
(74) *Attorney, Agent, or Firm* — Richard T. Ogawa; Ogawa P.C.

(57) ABSTRACT

A solar cell concentrator structure includes a first concentrator element having a first aperture region and a first exit region including a first back surface region and a first corner region. The structure also includes a second concentrator element integrally formed with the first concentrator element. The second concentrator element includes a second aperture region and a second exit region-including a second back surface region and a second corner region. Additionally, the structure includes a first radius of curvature of 0.25 mm and less characterizing the first corner structure and the second corner structure, a first coupling region between the first exit region and a first surface region of a first photovoltaic device. The structure further includes a second radius of curvature of 0.15 mm and less characterizing a region between the first concentrator element and the second concentrator element.

14 Claims, 9 Drawing Sheets

SOLAR CELL STRUCTURE INCLUDING A PLURALITY OF CONCENTRATOR ELEMENTS WITH A NOTCH DESIGN AND PREDETERMINED RADII AND METHOD

CROSS-REFERENCES TO RELATED APPLICATIONS

This application is related to U.S. Patent Application No. 60/969,949, filed at Sep. 5, 2007 and U.S. patent application Ser. No. 11/445,933, filed at Jun. 2, 2006. This application claims priority to U.S. Patent Application No. 61/019,135, filed Jan. 4, 2008, and U.S. patent application Ser. No. 12/060,769, filed Apr. 1, 2008, which claims priority to U.S. patent application Ser. No. 11/695,566, filed Apr. 2, 2007. All of these applications are commonly assigned, and hereby incorporated by reference.

BACKGROUND OF THE INVENTION

The present invention relates generally to solar energy techniques. In particular, the present invention provides a method and resulting device fabricated from a plurality of concentrating elements respectively coupled to a plurality of photovoltaic regions. More particularly, the present method and structure are directed to a notch structure provided between a pair of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and resulting device fabricated from a plurality of concentrating elements respectively coupled to a plurality of photovoltaic regions. More particularly, the present method and structure are directed to a notch structure provided between a pair of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

In a specific embodiment, the present invention provides a solar cell concentrator structure. The solar cell concentrator structure includes a first concentrator element. The first concentrator element includes a first aperture region and a first exit region. The first exit region includes a first back surface region and a first corner region. The solar cell concentrator structure further includes a second concentrator element integrally formed with the first concentrator element. The second concentrator element includes a second aperture region and a second exit region. The second exit region includes a second back surface region and a second corner region. Additionally, the solar cell concentrator structure includes a first radius of curvature of 0.25 mm and less characterizing the first corner structure and the second corner structure. The solar cell concentrator structure also includes a first coupling region between the first exit region and a first surface region of a first photovoltaic device and a second coupling region between the second exit region and a second surface region of a second photovoltaic device. Moreover, the solar cell concentrator structure includes a separation region provided between the first concentrator element and the second concentrator element. The separation region is characterized by a width separating the first exit region from the second exit region. Furthermore, the solar cell concentrator structure includes a second radius of curvature of 0.15 mm and less characterizing a region between the first concentrator element and the second concentrator element, a triangular shaped region including an apex defined by the radius of curvature and a base defined by the separation region, and a refractive index of about 1 characterizing the triangular region.

In another specific embodiment, the invention provides a solar module concentrator structure. The solar module concentrator structure includes a plurality of elongated concentrating units. Each of the plurality of elongated concentrating units comprises a concentrator element. The concentrator element includes an aperture region and an exit region. The exit region includes a back surface region and a corner structure. Each of the plurality of elongated concentrating units also includes a radius of curvature of 0.25 mm and less characterizing the corner structure and a coupling region between the exit region and a photovoltaic region.

In yet another specific embodiment, the present invention provides a solar cell concentrator structure. The solar cell concentrator structure includes a piece of optical material characterized by a first spatial direction and a second spatial direction. The first spatial direction is normal to the second spatial direction. The solar cell concentrator structure further includes a first concentrator element and a second concentrator element provided within a first portion of the piece of optical material and a second portion of the piece of optical material, respectively, defined along the second spatial direction. Additionally, the solar cell concentrator structure includes an aperture region provided on a first surface region of the piece of optical material. The aperture region is adapted to allow electromagnetic radiation to be illuminated thereon. The solar cell concentrator structure also includes an exit region provided on a second surface region of the piece of optical material. The exit region is adapted to allow electromagnetic radiation to be outputted and is characterized by a corner region having a first radius of curvature of about 0.25 mm and less. Moreover, the solar cell concentrator structure includes a separation region provided between the first concentrator element and the second concentrator element. The separation region is characterized by a width within a vicinity of the exit region. Furthermore, the solar cell concentrator structure includes a radius of curvature of 0.15 mm and less within a predetermined depth of the piece of optical material. The radius of curvature is provided between the first concentrator element and the second concentrator element.

In an alternative embodiment, the present invention provides a method for manufacturing a solar cell. The method includes a step of providing a solar concentrator structure. The structure includes a first concentrator element with a first aperture region and a first exit region and a second concentrator element integrally formed with the first concentrator element. The second concentrator element includes a second aperture region and a second exit region. The solar concentrator structure also includes a separation region provided between the first concentrator element and the second concentrator element. The separation region is characterized by a width separating the first exit region from the second exit region. Additionally, the solar concentrator structure includes a radius of curvature of 0.15 mm and less characterizing a region between the first concentrator element and the second concentrator element and a triangular region including an apex formed by the radius of curvature and a base formed by the separation region. Moreover, the solar concentrator structure includes a refractive index of about 1.0 characterizing the triangular region. The method further includes a step of coupling a first photovoltaic region to the first concentrator element and a step of coupling a second photovoltaic region to the second concentrator element.

In another alternative embodiment, the invention provides a solar concentrator structure. The solar concentrator structure includes a thickness of material characterized along a first spatial direction including at least a first concentrator element and a second concentrator element provided within a first portion of the thickness of material and a second portion of the thickness of material defined along a second spatial direction. The solar concentrator structure also includes an aperture region provided on a first surface region of the thickness of material. The aperture region is adapted to allow electromagnetic radiation to be illuminated thereon. Additionally, the solar concentrator structure includes an exit region provided on a second surface region of the thickness of material. The exit region is adapted to allow electromagnetic radiation to be outputted. Moreover, the solar concentrator structure includes a separation region provided between the first concentrator element and the second concentrator element. The separation region is characterized by a width within a vicinity of the exit region. Furthermore, the solar concentrator structure includes a radius of curvature of 0.15 mm and less within a predetermined depth of the thickness of material.

Many benefits are achieved by way of the present invention over conventional techniques. For example, the invention provides for an improved solar cell concentrator structure for manufacture of solar module. Such solar concentrator structure uses a single piece of polymeric or glass webbing or a combination integrally including a plurality of elongated concentrating units each comprising a geometric light concentrator element coupled to one of a plurality of photovoltaic strips. In a preferred embodiment, the geometric light concentrator element has a geometric concentration characteristic with an aperture to exit ratio in a range from about 1.8 to about 4.5 and the exit region includes two exit notches with a radius of curvature of 0.25 mm and less characterizing the corresponding two corner structures. In another preferred embodiment, between the exit region of the concentrator element and a photovoltaic strip there is a coupling region that is configured to have its refractive index matched and accommodate the radius of the exit notches. The use of concentrator according to the present invention helps the solar conversion module having less photovoltaic material per surface area (e.g., 80% or less, 50% or less) than conventional solar panel module. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related to solar energy are provided. In particular, the present invention provides a method and resulting device fabricated from a plurality of concentrating elements respectively coupled to a plurality of photovoltaic regions. More particularly, the present method and structure are directed to a notch structure provided between a pair of concentrating elements. In a specific embodiment, the notch structure is implemented to improve efficiency of the multiple concentrator structure. Merely by way of example, the invention has been applied to solar panels, commonly termed modules, but it would be recognized that the invention has a much broader range of applicability.

Figure 1:
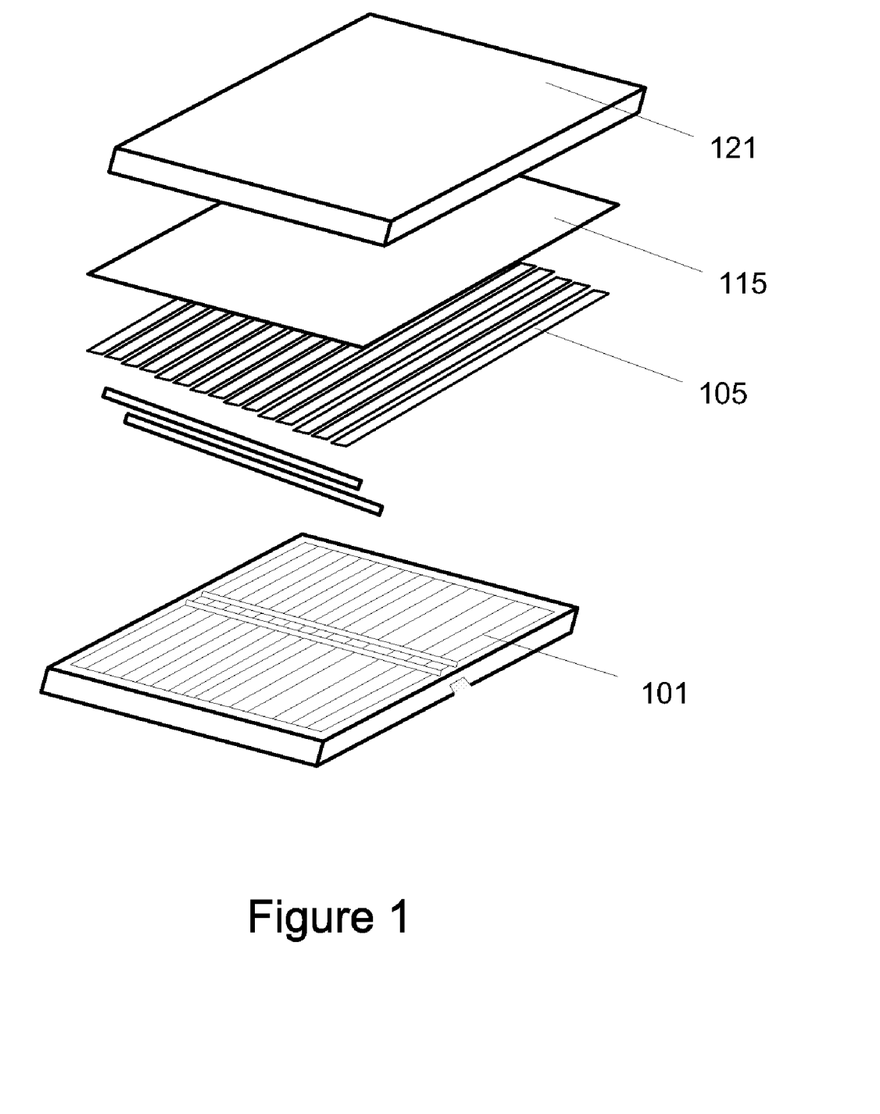
FIG. 1 is a simplified diagram of a solar cell according to an embodiment of the present invention.

FIG. 1 is a simplified diagram of a solar cell according to an embodiment of the present invention. This diagram is merely an example, which should not unduly limit the scope of the claims herein. One of ordinary skill in the art would recognize other variations, modifications, and alternatives. As shown is an expanded view of the present solar cell device structure, which includes various elements. The device has a back cover member 101, which includes a surface area and a back area. The back cover member also has a plurality of sites, which are spatially disposed, for electrical members, such as bus bars, and a plurality of photovoltaic regions. Alternatively, the back cover can be free from any patterns and is merely provided for support and packaging. Of course, there can be other variations, modifications, and alternatives.

In a preferred embodiment, the device has a plurality of photovoltaic strips 105, each of which is disposed overlying the surface area of the back cover member. In a preferred embodiment, the plurality of photovoltaic strips corresponds to a cumulative area occupying a total photovoltaic spatial region, which is active and converts sunlight into electrical energy.

An encapsulating material 115 is overlying a portion of the back cover member. That is, an encapsulating material forms overlying the plurality of strips, and exposed regions of the back cover, and electrical members. In a preferred embodiment, the encapsulating material can be a single layer, multiple layers, or portions of layers, depending upon the application. In alternative embodiments, as noted, the encapsulating material can be provided overlying a portion of the photovoltaic strips or a surface region of the front cover member, which would be coupled to the plurality of photovoltaic strips. Of course, there can be other variations, modifications, and alternatives.

In a specific embodiment, a front cover member 121 is coupled to the encapsulating material. That is, the front cover member is formed overlying the encapsulate to form a multilayered structure including at least the back cover, bus bars, plurality of photovoltaic strips, encapsulate, and front cover. In a preferred embodiment, the front cover includes one or more concentrating elements, which concentrate (e.g., intensify per unit area) sunlight onto the plurality of photovoltaic strips. That is, each of the concentrating elements can be associated respectively with each of or at least one of the photovoltaic strips.

Upon assembly of the back cover, bus bars, photovoltaic strips, encapsulate, and front cover, an interface region is provided along at least a peripheral region of the back cover member and the front cover member. The interface region may also be provided surrounding each of the strips or certain groups of the strips depending upon the embodiment. The device has a sealed region and is formed on at least the interface region to form an individual solar cell from the back cover member and the front cover member. The sealed region maintains the active regions, including photovoltaic strips, in a controlled environment free from external effects, such as weather, mechanical handling, environmental conditions, and other influences that may degrade the quality of the solar cell. Additionally, the sealed region and/or sealed member (e.g., two substrates) protect certain optical characteristics associated with the solar cell and also protects and maintains any of the electrical conductive members, such as bus bars, interconnects, and the like.

Of course, there can be other benefits achieved using the sealed member structure according to other embodiments.

In a preferred embodiment, the total photovoltaic spatial region occupies a smaller spatial region than the surface area of the back cover. That is, the total photovoltaic spatial region uses less silicon than conventional solar cells for a given solar cell size. In a preferred embodiment, the total photovoltaic spatial region occupies about 80% and less of the surface area of the back cover for the individual solar cell. Depending upon the embodiment, the photovoltaic spatial region may also occupy about 70% and less or 60% and less or preferably 50% and less of the surface area of the back cover or given area of a solar cell. Of course, there can be other percentages that have not been expressly recited according to other embodiments. Here, the terms "back cover member" and "front cover member" are provided for illustrative purposes, and not intended to limit the scope of the claims to a particular configuration relative to a spatial orientation according to a specific embodiment. Further details of each of the various elements in the solar cell can be found throughout the present specification and more particularly below.

In a specific embodiment, the present invention provides a packaged solar cell assembly being capable of stand-alone operation to generate power using the packaged solar cell assembly and/or with other solar cell assemblies. The packaged solar cell assembly includes rigid front cover member having a front cover surface area and a plurality of concentrating elements thereon. Depending upon applications, the rigid front cover member consist of a variety of materials. For example, the rigid front cover is made of polymer material. As another example, the rigid front cover is made of transparent polymer material having a reflective index of about 1.4 or 1.42 or greater. According to an example, the rigid front cover has a Young's Modulus of a suitable range. Each of the concentrating elements has a length extending from a first portion of the front cover surface area to a second portion of the front cover surface area. Each of the concentrating elements has a width provided between the first portion and the second portion. Each of the concentrating elements having a first edge region coupled to a first side of the width and a second edge region provided on a second side of the width. The first edge region and the second edge region extend from the first portion of the front cover surface area to a second portion of the front cover surface area. The plurality of concentrating elements is configured in a parallel manner extending from the first portion to the second portion.

It is to be appreciated that embodiment can have many variations. For example, the embodiment may further includes a first electrode member that is coupled to a first region of each of the plurality of photovoltaic strips and a second electrode member coupled to a second region of each of the plurality of photovoltaic strips.

As another example, the solar cell assembly additionally includes a first electrode member coupled to a first region of each of the plurality of photovoltaic strips and a second electrode member coupled to a second region of each of the plurality of photovoltaic strips. The first electrode includes a first protruding portion extending from a first portion of the sandwiched assembly and the second electrode comprising a second protruding portion extending from a second portion of the sandwiched assembly.

In yet another specific embodiment, the present invention provides a solar cell apparatus. The solar cell apparatus includes a backside substrate member comprising a backside surface region and an inner surface region. Depending upon application, the backside substrate member can be made from various materials. For example, the backside member is characterized by a polymer material.

In yet another embodiment, the present invention provides a solar cell apparatus that includes a backside substrate member. The backside substrate member includes a backside surface region and an inner surface region. The backside substrate member is characterized by a width. For example, the backside substrate member is characterized by a length of about eight inches and less. As an example, the backside substrate member is characterized by a width of about 8 inches and less and a length of more than 8 inches. Of course, there can be other variations, modifications, and alternatives. Further details of the solar cell assembly can be found in U.S. patent application Ser. No. 11/445,933, commonly assigned, and hereby incorporated by reference herein.

Figure 2:
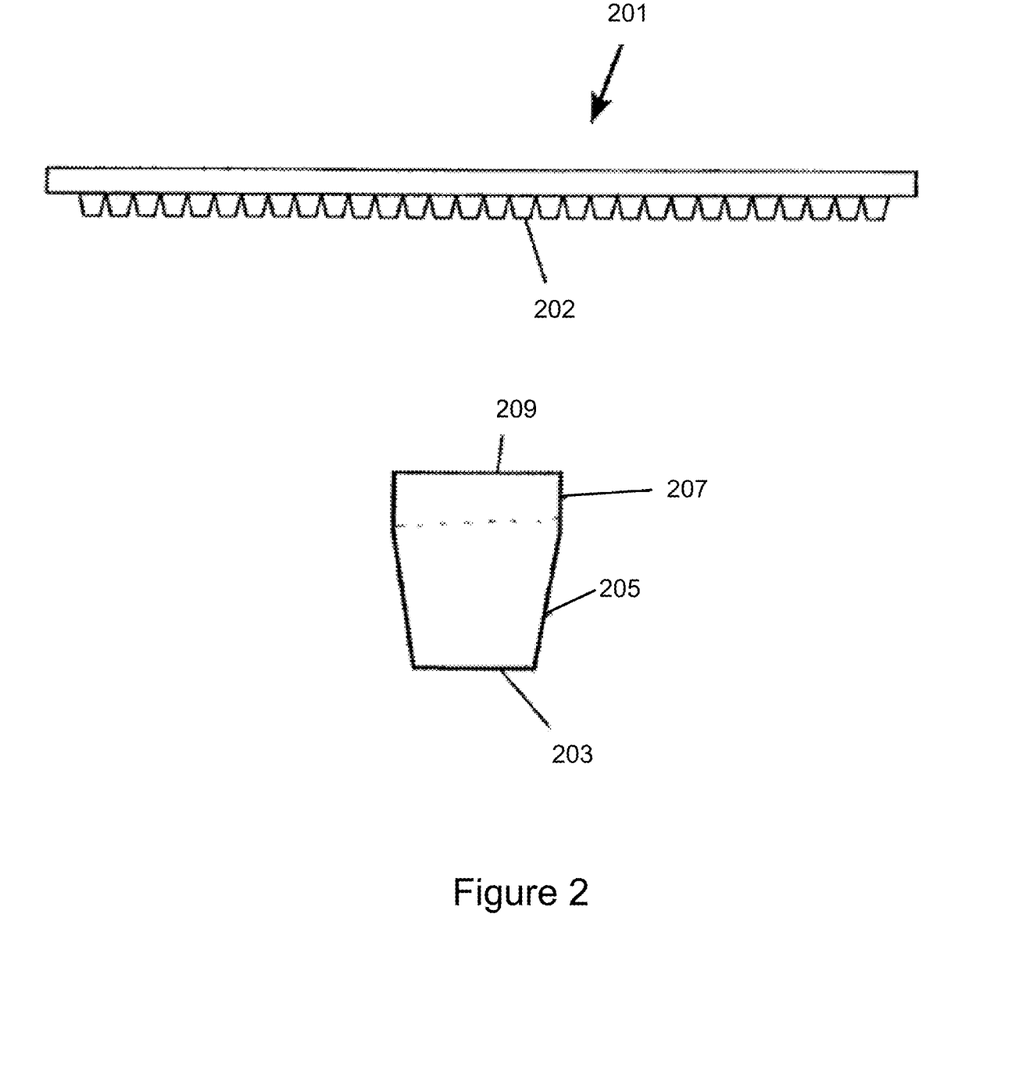
FIG. 2 is a simplified diagram of solar cell concentrating elements according to an embodiment of the present invention.

FIG. 2 is a simplified diagram of solar cell concentrating elements according to an embodiment of the present invention. This diagram is merely an example, which should not unduly limit the scope of the claims herein. One of ordinary skill in the art would recognize other variations, modifications, and alternatives. As shown, each of the concentrating elements for the strip configuration includes a trapezoidal shaped member. Each of the trapezoidal shaped members has a bottom surface 201 coupled to a pyramidal shaped region 205 coupled to an upper region 207. The upper region is defined by surface 209, which is co-extensive of the front cover. Each of the members is spatially disposed and in parallel to each other according to a specific embodiment. Here, the term "trapezoidal" or "pyramidal" may include embodiments with straight or curved or a combination of straight and curved walls according to embodiments of the present invention. Depending upon the embodiment, the concentrating elements may be on the front cover, integrated into the front cover, and/or be coupled to the front cover according to embodiments of the present invention. Further details of the front cover with concentrating elements are provided more particularly below.

In a specific embodiment, a solar cell apparatus includes a shaped concentrator device operably coupled to each of the plurality of photovoltaic strips. The shaped concentrator device has a first side and a second side. In addition, the solar cell apparatus includes an aperture region provided on the first side of the shaped concentrator device. As merely an example, the concentrator device includes a first side region and a second side region. Depending upon application, the first side region is characterized by a roughness of about 100 nanometers or 120 nanometers RMS and less, and the second side region is characterized by a roughness of about 100 nanometers or 120 nanometers RMS and less. For example, the roughness is characterized by a dimension value of about 10% of a light wavelength derived from the aperture regions. Depending upon applications, the backside member can have a pyramid-type shape.

As an example, the solar cell apparatus includes an exit region provided on the second side of the shaped concentrator device. In addition, the solar cell apparatus includes a geometric concentration characteristic provided by a ratio of the aperture region to the exit region. The ratio can be characterized by a range from about 1.8 to about 4.5. The solar cell apparatus also includes a polymer material characterizing the shaped concentrator device. The solar cell apparatus additionally includes a refractive index of about 1.45 and greater characterizing the polymer material of the shaped concentrator device. Additionally, the solar cell apparatus includes a coupling material formed overlying each of the plurality of photovoltaic strips and coupling each of the plurality of photovoltaic regions to each of the concentrator devices. For example, the coupling material is characterized by a suitable Young's Modulus.

As merely an example, the solar cell apparatus includes a refractive index of about 1.45 and greater characterizing the coupling material coupling each of the plurality of photovoltaic regions to each of the concentrator device. Depending upon application, the polymer material is characterized by a thermal expansion constant that is suitable to withstand changes due to thermal expansion of elements of the solar cell apparatus.

For certain applications, the plurality of concentrating elements has a light entrance area (A1) and a light exit area (A2) such that A2/A1 is 0.8 and less. As merely an example, the plurality of concentrating elements has a light entrance area (A1) and a light exit area (A2) such that A2/A1 is 0.8 and less, and the plurality of photovoltaic strips are coupled against the light exit area. In a preferred embodiment, the ratio of A2/A1 is about 0.5 and less. For example, each of the concentrating elements has a height of 7 mm or less. In a specific embodiment, the sealed sandwiched assembly has a width ranging from about 100 millimeters to about 210 millimeters and a length ranging from about 100 millimeters to about 210 millimeters. In a specific embodiment, the sealed sandwiched assembly can even have a length of about 300 millimeters and greater. As another example, each of the concentrating elements has a pair of sides. In a specific embodiment, each of the sides has a surface finish of 100 nanometers or less or 120 nanometers and less RMS. Of course, there can be other variations, modifications, and alternatives.

Figure 2A:
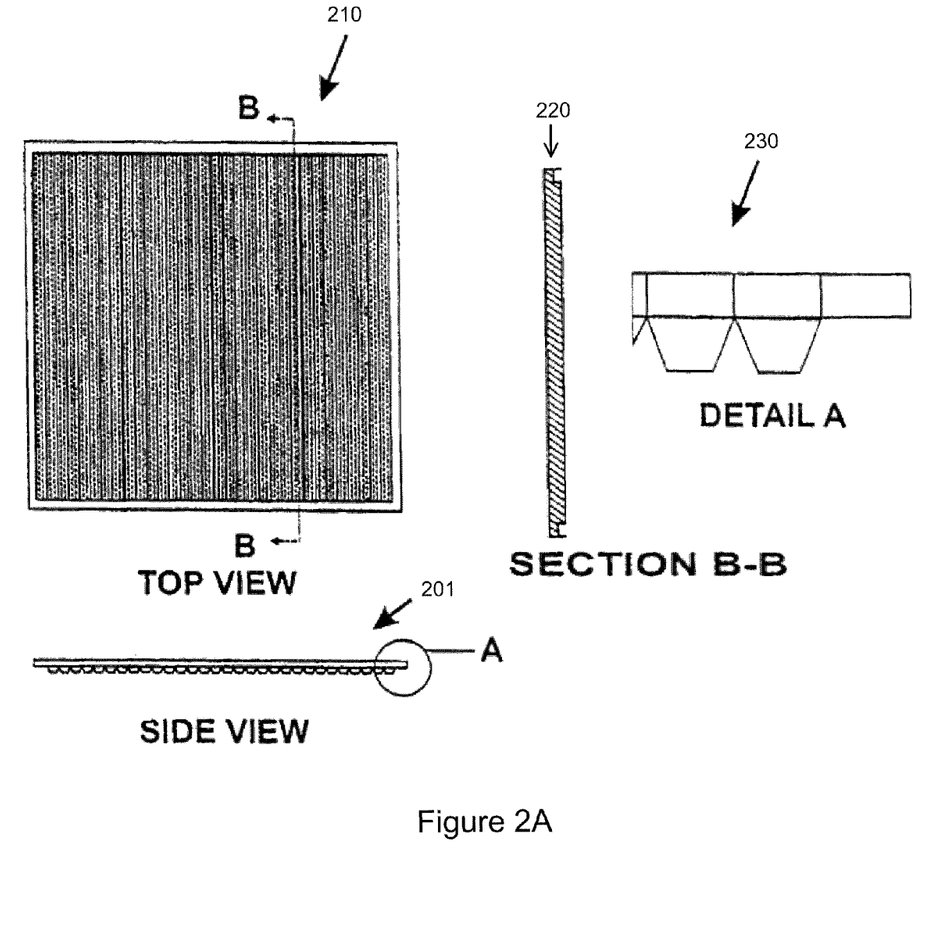
FIG. 2A is a simplified side-view diagram of solar cell concentrating elements according to an embodiment of the present invention.

Referring now to FIG. 2A, the front cover has been illustrated using a side view 201, which is similar to FIG. 2. The front cover also has a top-view illustration 210. A section view 220 from "B-B" has also been illustrated. A detailed view "A" of at least two of the concentrating elements 230 is also shown. Depending upon the embodiment, there can be other variations, modifications, and alternatives.

Depending upon the embodiment, the concentrating elements are made of a suitable material. The concentrating elements can be made of a polymer, glass, or other optically transparent materials, including any combination of these, and the like. The suitable material is preferably environmentally stable and can withstand environmental temperatures, weather, and other "outdoor" conditions. The concentrating elements can also include portions that are coated with an anti-reflective coating for improved efficiency. Coatings can also be used for improving a durability of the concentrating elements. Of course, there can be other variations, modifications, and alternatives.

In a specific embodiment, the solar cell apparatus includes a first reflective side provided between a first portion of the aperture region and a first portion of the exit region. As merely an example, the first reflective side includes a first polished surface of a portion of the polymer material. For certain applications, the first reflective side is characterized by a surface roughness of about 120 nanometers RMS and less.

Moreover, the solar cell apparatus includes a second reflective side provided between a second portion of the aperture region and a second portion of the exit region. For example, the second reflective side comprises a second polished surface of a portion of the polymer material. For certain applications, the second reflective side is characterized by a surface roughness of about 120 nanometers and less. As an example, the first reflective side and the second reflective side provide for total internal reflection of one or more photons provided from the aperture region.

In addition, the solar cell apparatus includes a geometric concentration characteristic provided by a ratio of the aperture region to the exit region. The ratio is characterized by a range from about 1.8 to about 4.5. Additionally, the solar cell apparatus includes a polymer material characterizing the shaped concentrator device, which includes the aperture region, exit region, first reflective side, and second reflective side. As an example, the polymer material is capable of being free from damaged caused by ultraviolet radiation.

Furthermore, the solar cell apparatus has a refractive index of about 1.45 and greater characterizing the polymeric and/or glass material of the shaped concentrator device. Moreover, the solar cell apparatus includes a coupling material formed overlying each of the plurality of photovoltaic strips and coupling each of the plurality of photovoltaic regions to each of the concentrator devices. The solar cell apparatus additionally includes one or more pocket regions facing each of the first reflective side and the second reflective side. The one or more pocket regions can be characterized by a refractive index of about 1 to cause one or more photons from the aperture region to be reflected toward the exit region. To maintain good efficiency of the subject concentrator devices, each of the concentrating elements is separated by a region having a notch structure of a predetermined size and shape according to a specific embodiment. Additionally, the exit region of each of the shaped concentrator device includes a corner structure having a first predetermined size and shape to also allow for good efficiency of the subject concentrator devices. Further details of the notch structures and the corner structures can be found throughout the present specification and more particularly below.

Figure 3:
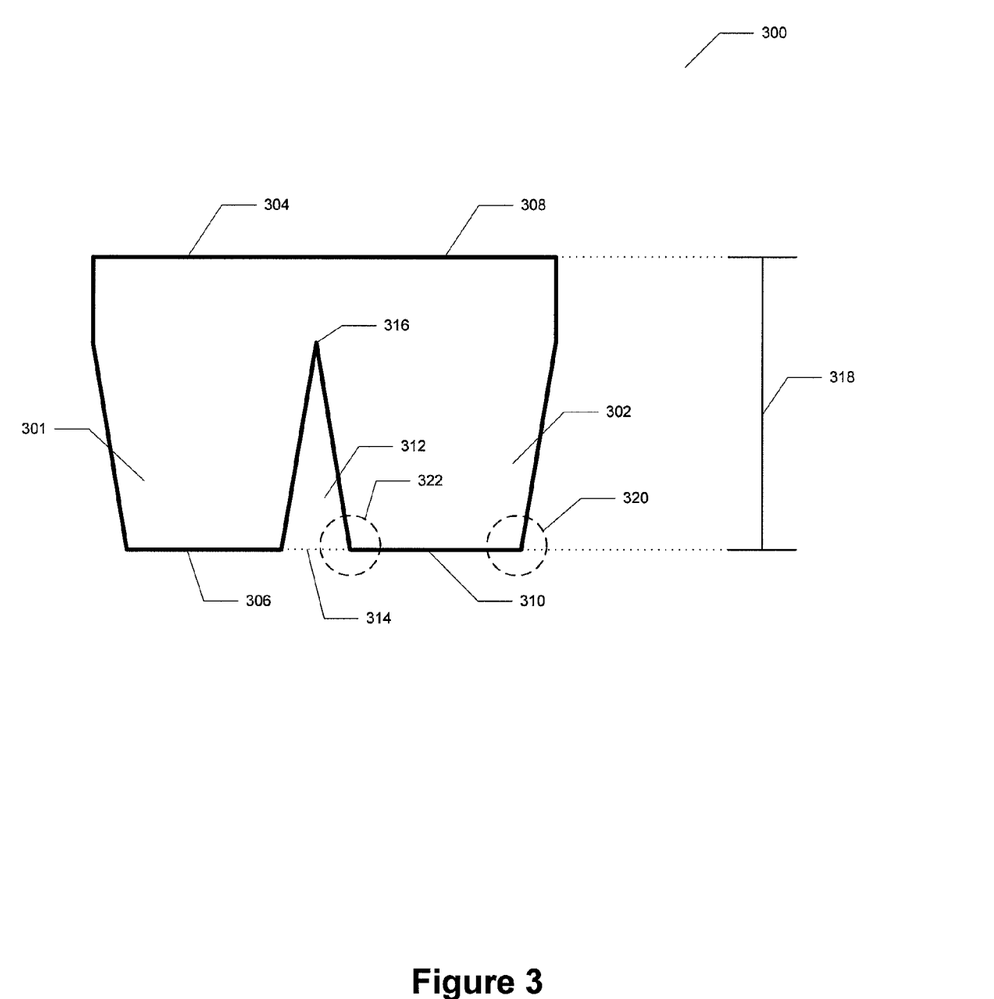
FIG. 3 is a simplified diagram of a plurality of notch structures for a solar cell concentrator according to an embodiment of the present invention.

FIG. 3 is a simplified diagram of a plurality of notch structures and corner structures for a solar cell concentrator 300 according to an embodiment of the present invention. This diagram is merely an example, which should not unduly limit the scope of the claims herein. One of ordinary skill in the art would recognize other variations, modifications, and alternatives. As shown, the concentrator structure has a first concentrator element 301, which includes a first aperture region 304 and a first exit region 306. The concentrator structure also includes a second concentrator element 302 integrally formed with the first concentrator element. In a specific embodiment, the second concentrator element includes a second aperture region 308 and a second exit region 310.

In a specific embodiment, the concentrator structure has a separation region 312 provided between the first concentrator element and the second concentrator element. The separation region is characterized by a width 314 separating the first exit region from the second exit region. As shown the separation region includes a triangular shaped region—having an apex 316 defined by a radius of curvature of 0.15 mm and less and a base defined by the separation region. In a specific embodiment, the triangular region has a refractive index of about one, which can be essentially an air gap and/or other non-solid open region. The apex of the triangular region is provided within a thickness of material 318 of the concentrator structure. Also shown in FIG. 3, each of the concentrator elements includes a first corner structure 320 and a second corner structure 322 in a portion of the exit region. The corner structure 322 is characterized by an exit radius curvature. The exit radius curvature is predetermined in conjunction with the radius of curvature of the apex 316 to optimize performance of the solar cell. In addition, the manufacturing costs, structural integrity, and/or strength may also be a consideration in determining the exit radius. For example, the exit radius is greater than a critical radius where the concentrator structure is likely to crack. More detailed discuss is provide below.

Figure 4:
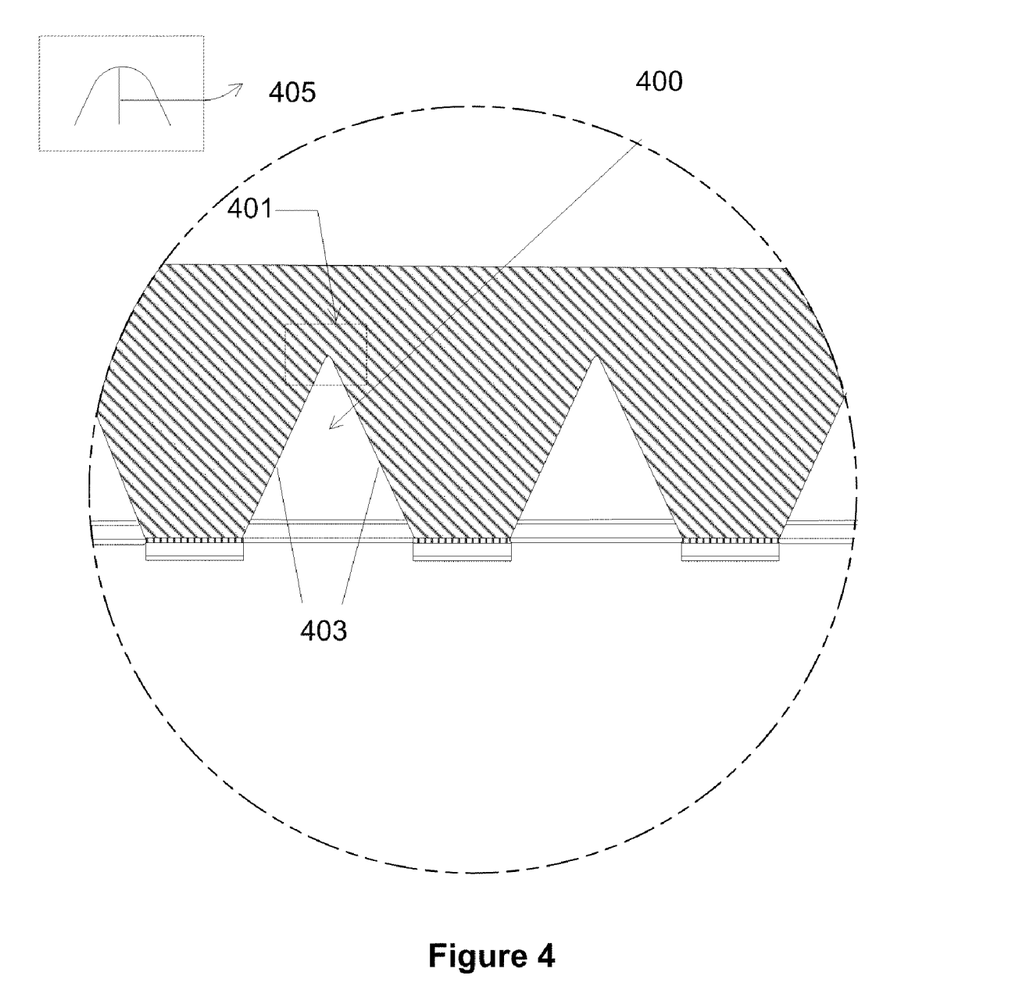
FIG. 4 is a more detailed diagram of a notch structure for a solar cell concentrator according to an embodiment of the present invention.

FIG. 4 is a more detailed diagram of a notch structure for a solar cell concentrator according to an embodiment of the present invention. This diagram is merely an example, which should not unduly limit the scope of the claims herein. One of ordinary skill in the art would recognize other variations, modifications, and alternatives. As shown in FIG. 4, the apex of the triangular region includes a notch structure characterized by an apex region 401 and wall regions 403. In a specific embodiment, the wall regions are straight. In certain other embodiments, the wall region may be curved. The notch structure describes a portion of a cross section of a triangular channel region provided between a first solar concentration element and a second solar concentration element. The term "notch" is not intended to be limited to the specification but should be construed by a common interpretation of the term. In a specific embodiment, the apex region is characterized by a radius of curvature 405. In a specific embodiment, the radius of curvature can be greater than about 0.001 mm. In an alternative embodiment, the radius of curvature can range from 0.05 mm to about 0.15 mm. Preferably, a minimum of radius of curvature is provided to maintain a structure/mechanical integrity of the solar cell concentrator in the temperature range of about −40 deg Celsius and 85 deg Celsius in accordance with IEC (International Electrotechnical Commission) 61215 specification according to a specific embodiment. Of course there can be other modifications, variations, and alternatives.

Figure 5:
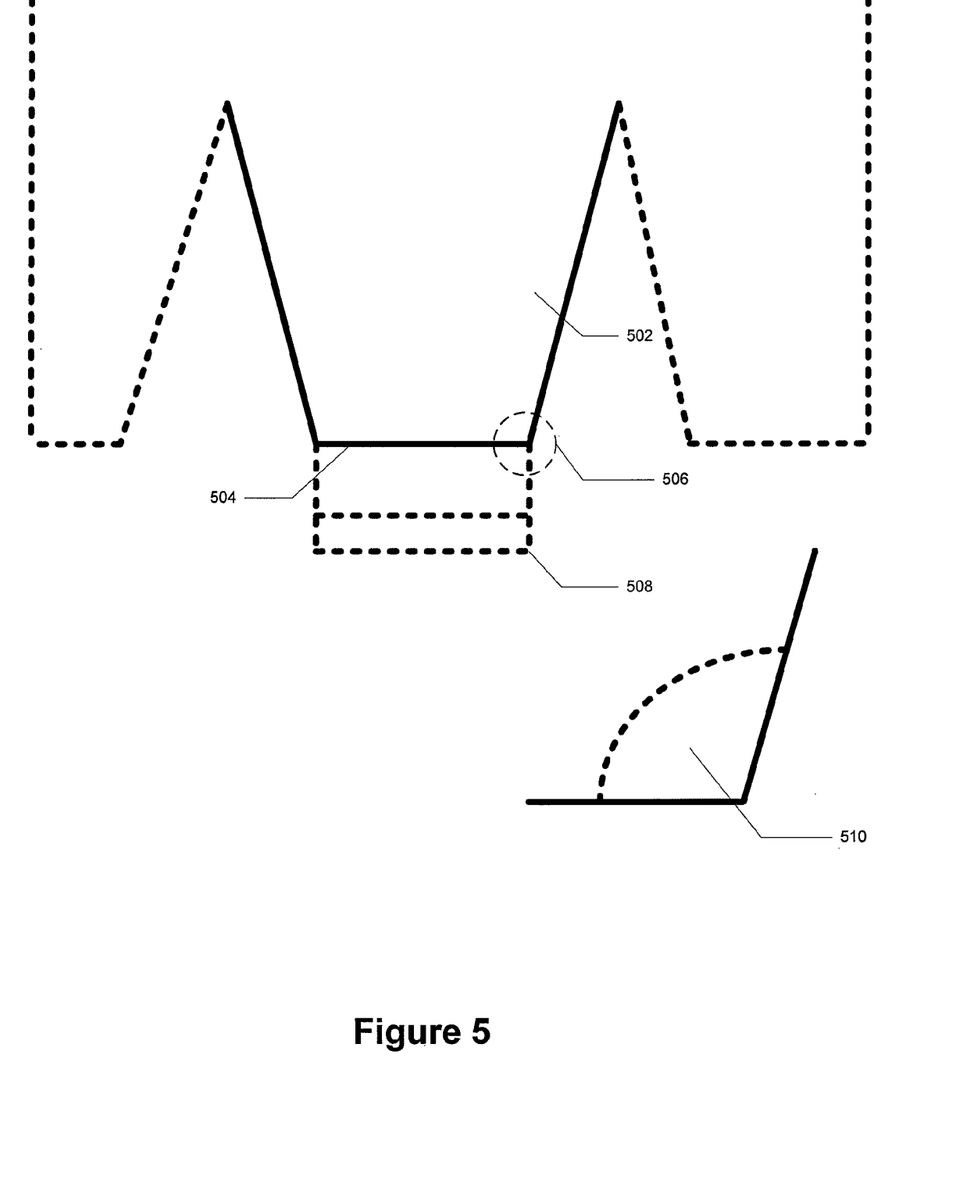
FIG. 5 is a plot of irradiation loss as a function of notch structure size according to an embodiment of the present invention.

FIG. 5 is a more detailed diagram illustrating a corner structure 506 of a concentrator element 502 according to an embodiment of the present invention. As shown, an exit region 504 is optically coupled to a photovoltaic region 508 in a specific embodiment. In a specific embodiment, the corner structure 506 is characterized by an exit radius of curvature 510. In a specific embodiment, the exit radius of curvature can be greater than about 0.001 mm. In an alternative embodiment, the exit radius of curvature can range from 0.025 to 0.15 mm. As explained above, the exit radius of the curvature is optimized to maintain an efficient transmission of electromagnetic radiation to the photovoltaic region in a specific embodiment. For example, the curvature 510 is determined using a variety of factors, such as the refractive index (and/or other optical properties) of the concentrator element, the angle of the exit aperture 316 illustrated in FIG. 3, and/or other factors. Of course there can be other variations, modifications, and alternatives.

In one embodiment, the solar concentrator can be made of materials selected from acrylic, or diamond, or quartz, or glass, or a combination of those materials. In a specific embodiment, the solar concentrator is fabricated using a mold having an edge radius of curvature of less than 0.15 mm. The material for making the concentrator can be injected through a fan gate, or a valve gate, or an extrusion filling the mold. The structural components may include a compression component and a heating component. The heating component may generate heat during the molding process via current or through an external heating source. Of course there can be other variations, modifications, and alternatives.

Figure 6:
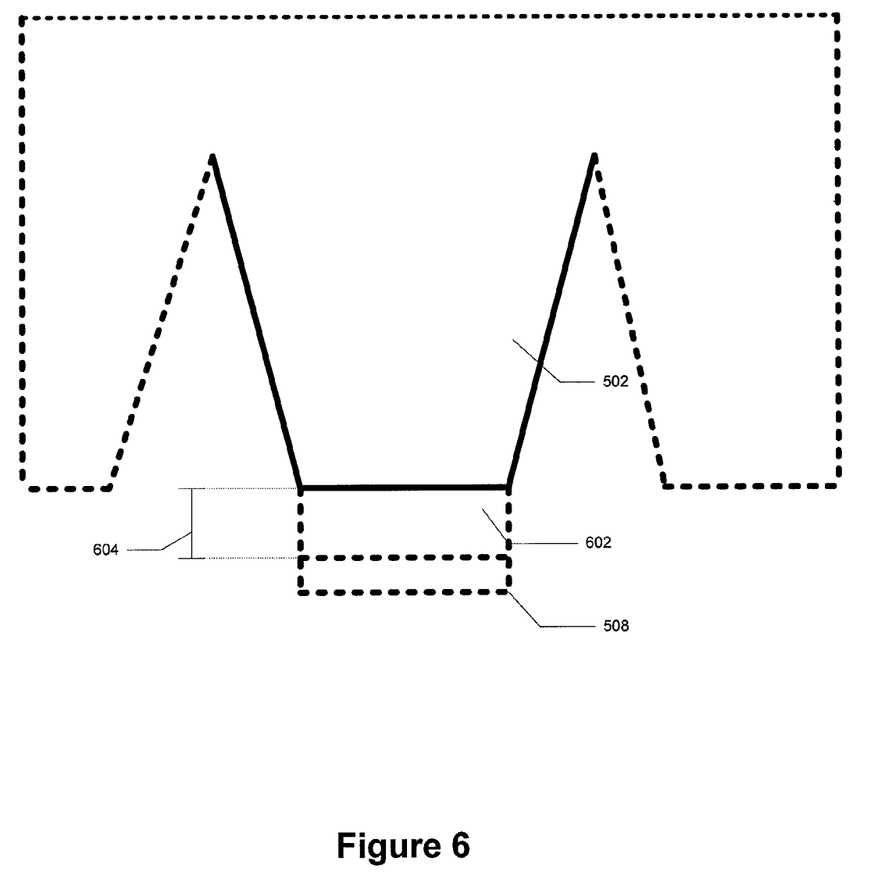
FIG. 6 is a simplified diagram of a coupling region provided between an exit region of an concentrator element and a photovoltaic region according to an embodiment of the present invention.

Also shown in FIG. 6, a coupling region 602 can be provided between an exit region of a concentrator element and a photovoltaic region. Like references are used in the present Figure and others and not intended to be limited. Merely for the purpose of illustration, various structures are not drawn in scale. In a specific embodiment, the exit region is optically coupled to the photovoltaic region using an optical coupling material within the coupling region. Examples of such optical coupling material can include optical grade epoxy, ethylene vinyl acetate (EVA), silicones, polyurethanes, and others. In a specific embodiment, the optical coupling material includes polyurethanes provided in a thickness of 0.025 to 0.25 mm. Of course one skilled in the art would recognize other variations, modifications, and alternatives.

Figure 7:
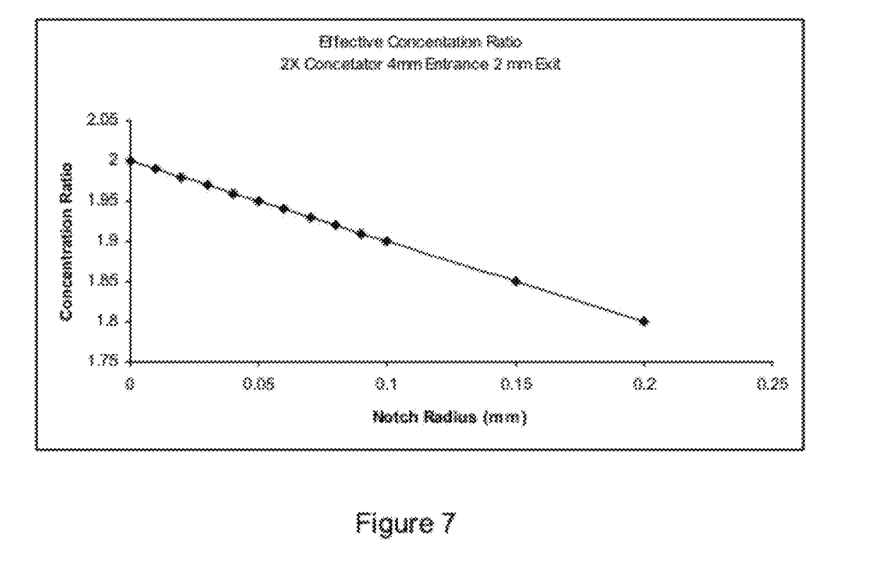
FIG. 7 is a plot of concentration ratio as a function of corner structure size of a solar cell concentrator according to an embodiment of the present invention.
Figure 8:
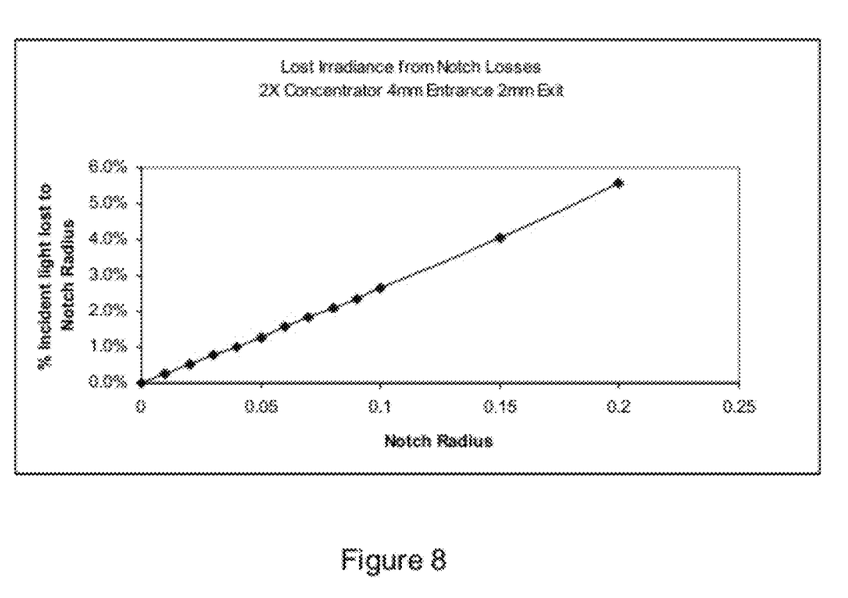
FIG. 8 is a plot of irradiation loss as a function of corner structure of the solar concentrator according to an embodiment of the present invention.

FIG. 7 is a plot of concentration ratio as a function of corner structure size of a solar cell concentrator according to an embodiment of the present invention. This diagram is merely an example, which should not unduly limit the scope of the claims herein. One of ordinary skill in the art would recognize other variations, modifications, and alternatives. As shown, the vertical axis illustrates concentration ratio and the horizontal axis illustrates notch structure size or radius of curvature. The result was obtained using a solar cell concentrator with an entrance of 4 mm and an exit of 2 mm. The concentration ratio generally decreases with an increase in exit radius of curvature of the corner structure. A corresponding plot of irradiation loss as a function of corner structure is shown in FIG. 8. As shown, the vertical axis illustrates percent of light loss or irradiation loss and the horizontal axis illustrates exit radius of curvature of the corner structure. The irradiation loss generally increases with an increase of exit radius. In a specific embodiment, the exit radius of curvature is optimized to allow for a maximum concentration ratio or a minimum scattering loss and to allow for maintaining mechanical/structural integrity of the solar cell concentrator in the temperature range between about −40 deg Celsius and 85 deg Celsius according to IEC 61215 specification according to a preferred embodiment.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A solar cell module comprising a solar cell concentrator structure, the solar cell concentrator structure comprising:
    a pair of concentrator elements formed from a thickness of glass material comprising a first concentrator element, the first concentrator element including a first aperture region and a first exit region, the first exit region including a first back surface region and a second concentrator element integrally formed with the first concentrator element, the second concentrator element including a second aperture region and a second exit region, the second exit region including a second back surface region, the thickness of glass material ranging from 5 to 7 mm;
    a first coupling region between the first exit region and a first surface region of a first photovoltaic device and a second coupling region between the second exit region and a second surface region of a second photovoltaic device;
    a separation region provided between the first concentrator element and the second concentrator element, the separation region being characterized by a width separating the first exit region from the second exit region;
    a radius of curvature characterizing a region between the first concentrator element and the second concentrator element, the radius of curvature being less than about 0.15 mm and greater than 0.001 mm and configured to reduce a scattering effect of a portion of an incident electromagnetic radiation;
    a triangular shaped region including an apex defined by the radius of curvature and a base defined by the separation region; and
    a refractive index of about 1 characterizing the triangular region.

2. The structure of claim 1 wherein the first concentrator element and the second concentrator element are characterized by a refractive index of about 1.4 and greater.

3. The structure of claim 1 wherein the first concentrator is characterized by a first truncated pyramid shape and the second concentrator is characterized by a second truncated pyramid shape.

4. The structure of claim 1 wherein the coupling region comprises an optical coupling material.

5. The structure of claim 4 wherein the optical coupling material comprises an optical grade epoxy, or ethylene vinyl acetate (EVA), or silicones, or polyurethanes.

6. The structure of claim 1 wherein the first concentrator element is optically coupled to a first photovoltaic region and the second concentrator element is optically coupled to a second photovoltaic region.

7. The structure of claim 1 wherein the second radius of curvature is greater than an amount that causes a crack within a portion of a thickness of the glass material.

8. A solar cell module comprising a solar cell concentrator structure, the solar cell concentrator structure comprising:
    a piece of optical glass material characterized by a first spatial direction and a second spatial direction, the first spatial direction being normal to the second spatial direction, the piece of optical glass material having a thickness ranging from 5 to 7 mm, the piece of optical glass material comprising a webbing including a first concentrator element characterized by a first truncated pyramid shape and a second concentrator element characterized by a second truncated pyramid shape and provided within a first portion of the piece of optical material and a second portion of the piece of optical material, respectively, defined along the second spatial direction;

an aperture region provided on a first surface region of the piece of optical material, the aperture region being adapted to allow electromagnetic radiation to be illuminated thereon;

an exit region provided on a second surface region of the piece of optical material, the exit region being adapted to allow electromagnetic radiation to be outputted;

a separation region provided between the first concentrator element and the second concentrator element, the separation region being characterized by a width within a vicinity of the exit region; and a radius of curvature of less than about 0.15 mm and greater than 0.001 mm within a predetermined depth of the piece of optical material; a triangular shaped region including an apex defined by the radius of curvature, the radius of curvature being provided between the first concentrator element and the second concentrator element.

9. The structure of claim 8 wherein the piece of optical material is essentially a glass.

10. The structure of claim 8 wherein the radius of curvature reduces an efficiency of the first concentrator element and the second concentrator element by about 50% and less.

11. The structure of claim 8 wherein the piece of optical material is characterized by a refractive index of about 1.4 and more.

12. The structure of claim 8 wherein the radius of curvature is an apex of a triangular region having a base provided within a portion of a first exit region of the first concentrator element and a second exit region of the second concentrator element.

13. The structure of claim 8 wherein the radius of curvature is an apex of a triangular region having a base provided within a portion of a first exit region of the first concentrator element and a second exit region of the second concentrator element, the triangular region having a refractive index of about 1.0.

14. A solar cell concentrator structure, the solar cell concentrator structure comprising:

a webbing characterized by a single piece of molded material comprising a first concentrator element, the first concentrator element including a first aperture region and a first exit region, the first exit region including a first back surface region, the first concentrator element being characterized by a refractive index of about 1.4 and greater and a second concentrator element integrally formed with the first concentrator element, the second concentrator element being characterized by a refractive index of about 1.4 and greater, the second concentrator element including a second aperture region and a second exit region, the second exit region including a second back surface region, the first concentrator element integrally formed with the second concentrator element, the first concentrator element being optically coupled to a first photovoltaic region and the second concentrator element being optically coupled to a second photovoltaic region, the webbing having a thickness ranging from about 5 to 7 mm;

a first coupling region between the first exit region and a first surface region of a first photovoltaic device, the first coupling region including an optical coupling material, an optical coupling material comprising an optical grade polyurethane material;

a second coupling region between the second exit region and a second surface region of a second photovoltaic device;

a separation region provided between the first concentrator element and the second concentrator element, the separation region being characterized by a width separating the first exit region from the second exit region;

a notch structure characterized by a radius of curvature characterizing a region between the first concentrator element and the second concentrator element, the radius of curvature being about between 0.001 mm and 0.15 mm;

a triangular shaped region including an apex defined by the radius of curvature and a base defined by the separation region; and a refractive index of about 1 characterizing the triangular region.

* * * * *